US010620605B2

(12) United States Patent
Buchanan et al.

(10) Patent No.: US 10,620,605 B2
(45) Date of Patent: *Apr. 14, 2020

(54) FINITE STATE MACHINES

(71) Applicant: HEWLETT PACKARD ENTERPRISE DEVELOPMENT LP, Houston, TX (US)

(72) Inventors: Brent Buchanan, Palo Alto, CA (US); John Paul Strachan, Palo Alto, CA (US); Le Zheng, Palo Alto, CA (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/354,076

(22) Filed: Mar. 14, 2019

(65) Prior Publication Data
US 2019/0235458 A1    Aug. 1, 2019

Related U.S. Application Data

(63) Continuation of application No. 15/885,193, filed on Jan. 31, 2018, now Pat. No. 10,261,487.

(51) Int. Cl.
*G05B 19/045* (2006.01)
*G11C 15/04* (2006.01)
*G11C 7/10* (2006.01)

(52) U.S. Cl.
CPC ............ *G05B 19/045* (2013.01); *G11C 15/04* (2013.01); *G05B 2219/23289* (2013.01); *G11C 7/1006* (2013.01)

(58) Field of Classification Search
None
See application file for complete search history.

(56) References Cited

U.S. PATENT DOCUMENTS

| 6,538,911 B1 * | 3/2003 | Allan ............... G11C 15/00 365/230.03 |
| 8,089,961 B2 | 1/2012 | Sahni et al. |
| 9,019,737 B2 | 4/2015 | Argyres |
| 9,070,435 B2 | 6/2015 | Iyengar |
| 9,424,366 B1 | 8/2016 | Gazit et al. |

(Continued)

OTHER PUBLICATIONS

Syed Iftekhar Ali and MD Shafiqul Islam, "Improved Charge-shared Match-line Sensing Scheme for Dynamic Energy Reduction in TCAM," IETE Journal of Research, Mar. 20, 2015, pp. 1-6 [online], Abstract, Retrieved from the Internet on Sep. 14, 2017 at URL: <tandfonline.com/doi/abs/10.1080/03772063.2015.1018847?src=recsys&journalCode=tijr20>.

(Continued)

*Primary Examiner* — Jany Richardson
(74) *Attorney, Agent, or Firm* — Hewlett Packard Enterprise Patent Department

(57) ABSTRACT

An example finite state machine may include a content-addressable memory. The content-addressable memory may include blocks that respectively store input-terms of the finite state machine. The finite state machine may be configured to, for each received input: select a subset of the blocks of the content addressable memory to enable for searching, the subset being selected based on a current state of the finite state machine, and determine a next state of the finite state machine by searching the currently enabled subset of blocks of the content addressable memory based on the input.

20 Claims, 9 Drawing Sheets

(56) References Cited

U.S. PATENT DOCUMENTS

| | | |
|---|---|---|
| 9,601,200 B2 | 3/2017 | Arsovski et al. |
| 2013/0205104 A1* | 8/2013 | Hesse .................. G05B 19/045 |
| | | 711/154 |
| 2016/0358654 A1 | 12/2016 | Holst |

OTHER PUBLICATIONS

Kun Huang et al., "Scalable TCAM-based Regular Expression Matching with Compressed Finite Automata," 2013; pp. 83-93, IEEE.

* cited by examiner

FINITE STATE MACHINES

BACKGROUND

A finite-state machine (FSM) (also known as a finite-state automaton (FSA), finite automaton, or state machine) is a machine that can assume a finite set of states (one state at a time), and changes from one of these states to another in response to received inputs. The FSM may be defined, for example, by a list of its possible states, its initial state, and conditions for transitioning from one state to another. Some FSMs may make use of content addressable memory (CAM), which may include, in some examples, ternary content addressable memory (TCAM).

CAM is a type of memory that can perform a search operation in which a data string may be input as search content and the resulting output is an address or other content-associated data of a location in the memory that stores matching data (if there is any). This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

TCAM is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

DETAILED DESCRIPTION

1. Example Finite State Machines—Overview

Figure 1A:
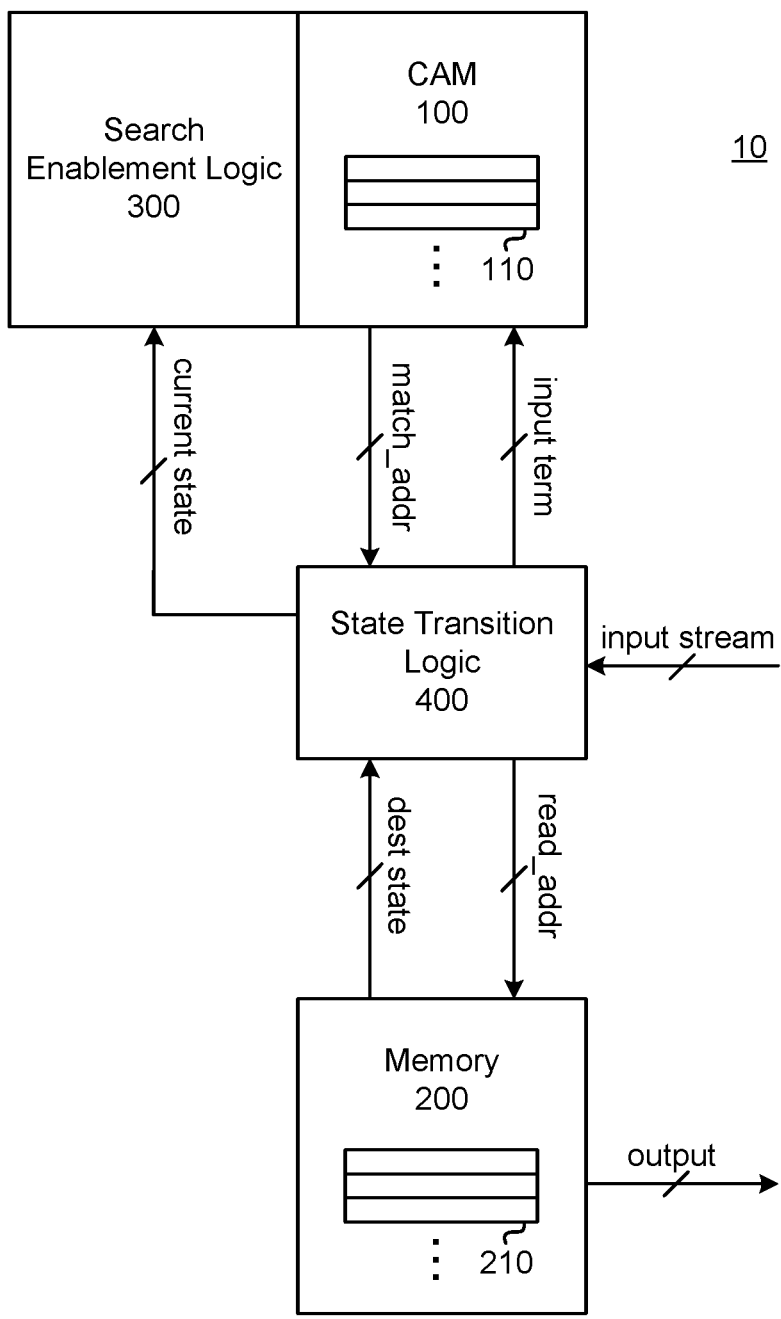
FIG. 1A is a diagram illustrating an example FSM.

Example FSMs described herein may include a CAM and another memory (such as a random access memory), which together may be used to determine state transitions of the FSM in response to received inputs. For example, the CAM may store terms that the FSM will recognize as valid inputs for each possible state of the FSM, and for each of these input terms the memory may store a corresponding state identifier. In such an example, when an input term is received, the FSM may determine what its next state should be by searching the CAM based on the input term and then reading the storage block of the memory that corresponds to the storage block of the CAM that matched the search. For example, when the CAM is searched, if the third storage block of the CAM matches the input term, then the third storage block of the memory may be read and the next state of the FSM may be the state identified in the third storage block of the memory.

In some examples, the storage blocks of the memory that store state identifiers may also store additional information associated with the state, such as an instruction. The instruction may cause the FSM to perform a particular action as a result of reaching the state. For example, if the fourth storage block of the memory stores the state identifier "3" and an instruction to clear a specified variable, then when the fourth storage block of the memory is read in response to an input term the FSM may transition to the state "3" and clear the specified variable.

In operation, the example FSM may receive a stream of multiple input terms, and may search the CAM and read the memory successively for each received input term, changing states along the way. Thus, the FSM may transition through a number of states until the input stream ends and/or the FSM reaches a terminal state. At termination, the state of the FSM may be indicative of something, such as whether the input stream was "accepted" or "rejected" by the FSM. For example, one application of such an FSM may be the parsing of a character stream to identify accepted words.

Furthermore, in example FSMs described herein, when the FSM searches the CAM based on a received input term, the FSM searches just those storage blocks of the CAM that are associated with the current state of the FSM, rather than searching the entire CAM. In particular, for each received input, the example FSM may enable a subset of the blocks of the CAM for searching and disable searching of the remaining blocks, with the blocks of the CAM that are enabled being selected based on the current state of the FSM. For example, the storage blocks of the CAM may be associated with particular FSM states, and the FSM may enable searching of only those storage blocks of the CAM that are associated with the current state of the FSM. For example, if the current state is "3" and blocks 16-28 of the CAM are associated with the state "3", then blocks 16-28 are enabled for searching while the remaining blocks of the CAM are disabled for searching. In some examples, enabling searching of a CAM block may include precharging a matchline associated with the storage block (or enabling the precharging), while disabling searching of the CAM block may include not precharging the matchline.

Because the example FSMs described herein search just those CAM blocks associated with the current state of the FSM, these FSMs may avoid a potential problem that might otherwise occur in which a search of the CAM does not return a unique match. In particular, a given input term may be a valid input for multiple FSM states, and therefore the input term may be recorded in multiple CAM blocks—specifically, the term may be recorded in one CAM block of each of the FSM states for which the term is a valid input. Because the same term may be stored in multiple CAM blocks, if the entire CAM were searched for a given input term then it is possible for there to be multiple CAM blocks that match the search. This potential problem may be avoided, however, by searching just those CAM blocks associated with the current state of the FSM.

In addition, because the example FSMs described herein search just those CAM blocks associated with the current state of the FSM, the amount of power used by the FSM may be greatly reduced. For example, in FSM's whose CAMs use matchline precharging, the matchlines of storage blocks that are not associated with the current state are not pre-charged, which saves a significant amount of power.

As noted above, the storage blocks of the CAM may be associated with the states of the FSM, and the FSM may use these associations to determine which blocks of the CAM to enable for searching. In some examples, the associations between CAM storage blocks and FSM states may be fixed (e.g., the FSM is "hardwired" to treat certain CAM blocks as being associated with certain FSM states), while in other examples the associations between CAM storage blocks and FSM states may be dynamically changed (e.g., the FSM may allocate and reallocate CAM blocks to FSM states).

As an example of fixed associations between CAM blocks and FSM states, the FSM may include enablement circuits corresponding respectively to the FSM states, and each of these enablement circuits may be fixedly associated with a subset of the CAM blocks. In such examples, each enablement circuit may be configured to control whether its CAM blocks are enabled. For example, the enablement circuits may each be configured to determine whether the current state of the FSM matches the enablement circuit's corresponding state, and if so the enablement circuit may generate an enable signal that controls whether searching is enabled for its CAM blocks.

As an example of dynamically changeable associations between CAM blocks and FSM states, the FSM may include a look-up table (LUT) in which ranges of CAM block addresses may be dynamically allocated to FSM states. In such examples, the current state of the FSM may be input to the LUT, and the LUT may output an indication of the range of CAM block addresses that is currently associated with the current state of the FSM. The FSM may then determine which CAM blocks to enable based on whether the blocks are within the address range output by the LUT. For example, the FSM may include an enablement circuit for each individual CAM block, which may be configured to control enablement of its CAM block based on whether the address of its CAM block is within the range output by the LUT.

In an alternative approach to avoiding the problem of the CAM potentially returning multiple matches for a single search term, some FSMs may store state identifiers in the CAM together with the possible input terms, and search the CAM based on both the current state and the received input term. In other words, for each input term that is to be stored in the CAM, the state associated with the input term may be prepended or appended to the input term and the resulting word may be what is actually stored in the CAM block. Then, when the CAM is searched, the current state may be prepended or appended to the received input term to generate the search word that the CAM is searched for. In this approach, unique CAM search results may be ensured.

Although this alternative approach does avoid the problem of non-unique CAM results, the approach entails searching the entire CAM for each received input term. Therefore such an FSM will use much more power than the example FSMs described herein in which only a subset of the CAM is searched for each received input term. In addition, because each CAM storage block in this alternative approach stores a state identifier in addition to the input term, the word storage size (i.e., the number of bit cells per storage block) in the CAM of the alternative approach must be larger than the word storage size in the example CAMs described herein, which store just the input term but not the state identifier. A larger word storage size results in a larger overall size and increased cost for these FSMs of the alternative approach as compared to the example FSMs described herein.

2. Example FSMs—Details

Figure 1B:
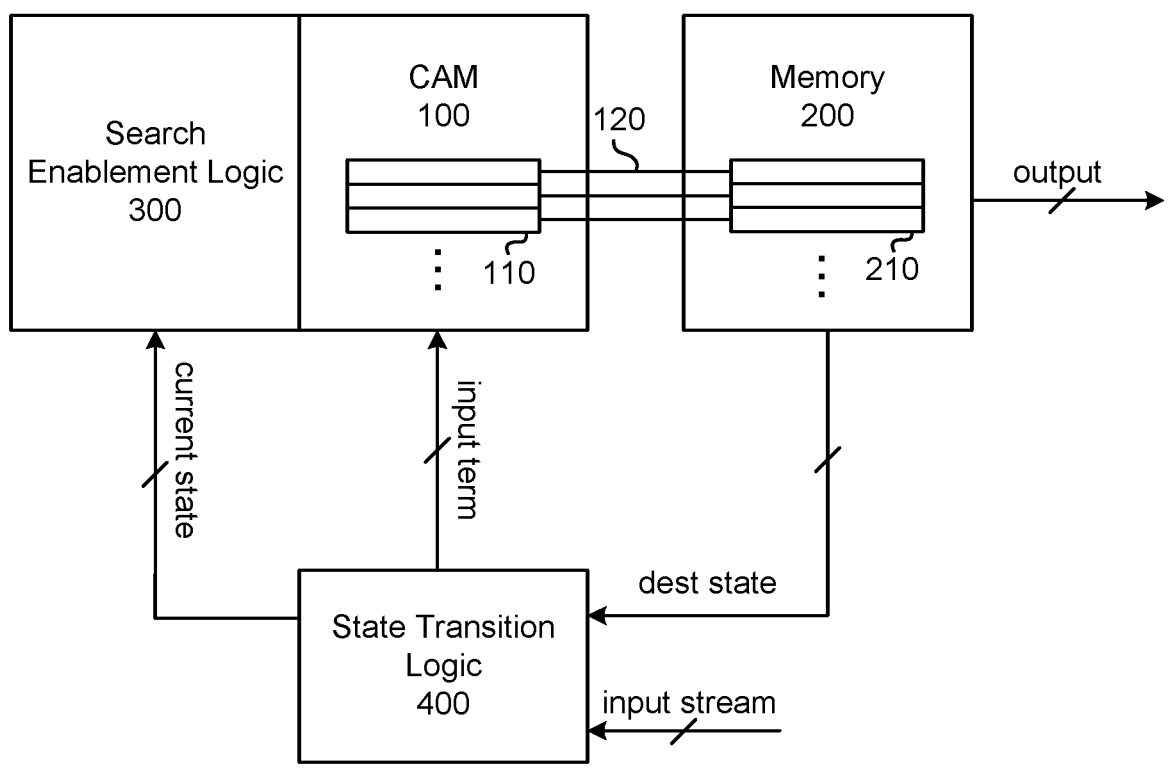
FIG. 1B is a diagram illustrating another example FSM.

FIGS. 1A and 1B illustrate an example FSM 10. The FSM 10 includes a CAM 100, a memory 200, search enablement logic 300, and state transition logic 400. The CAM 100 may store input terms of the FSM 10 in storage blocks 110, with each storage block 110 being associated with a state of the FSM 10. The memory 200 may store identifiers of states of the FSM 10 in storage blocks 210. In some examples, the memory 200 may also store additional information, such as instructions, in the storage blocks 210. The search enablement logic 300 may select a subset of the storage blocks 110 of the CAM 100 to enable for searching based on the current state of the FSM 10. The state transition logic 400 may receive an input stream comprising a series of input terms, and may control the state transitions of the FSM 10 based on the input stream.

In particular, for each input term of the input stream, the state transition logic 400 may provide the input term to the CAM 100 and cause the CAM 100 to be searched using the input term as a search word. Based on the current state of the FSM 10, the search enablement logic 300 may select a subset of the storage blocks 110 of the CAM 100 to enable for searching—specifically, the search enablement logic 300 may select those storage blocks 110 that are associated with the current state. Thus, when the CAM 100 is searched based on the input term, only a subset of the storage blocks thereof is searched.

The CAM 100 then outputs an indication (called "match_addr" herein) of the storage block 110 that matches the input term (if any). The state transition logic 400 may then output to the memory 200 an indication (called "read_addr" herein) of a particular storage block 210 that is to be read, based on match_addr and a predefined correspondence between storage blocks 110 and storage blocks 210.

One, both, or neither of match_addr and read_addr may be analog signals identifying the matching storage block 110 and/or the target storage block 210, and one, both, or neither of match_addr and read_addr may be digital signals encoding addresses of the matching storage block 110 and/or the target storage block 210. In some examples, the state transition logic 400 may translate match_addr into read_addr, while in other examples match_addr and read_addr may be identical, and match_addr may simply be passed straight through to the memory 200 as read_addr.

For example, as illustrated in FIG. 1B, each storage block 110's matchline 120 may be connected directly to its corresponding storage block 210 of the memory 200, such that the corresponding storage blocks 210 is automatically read when the matchline 120 of the corresponding storage block 110 indicates a match. This example may be beneficial in that encoding, decoding, translating, and/or other circuitry between the CAM 100 and the memory 200 may be omitted, thus simplifying the design and manufacture of the FSM 10, reducing power consumption, and potentially increasing speed of operation. In this example, match_addr and read_addr are formed by a single analog signal (i.e., the high voltage of the matchline 120 of the matching storage block 210).

As another example, as illustrated in FIG. 1A, match_addr and read_addr both are digital signals that encode addresses. More specifically, match_addr encodes the address of the matching block 110, while read_addr encodes the address of the corresponding storage block 210 that is to be read. This example may be beneficial in that correspondence relationships between blocks 110 and blocks 210 may be changed post-manufacture, since they are not hard-wired into the FSM 10. In some of these examples, match_addr and read_addr may be different, in which case the state transition logic 400 may translate match_addr and read_addr. In other examples, match_addr and read_addr may be identical, in which case match_addr may simply be input directly from the CAM 100 to the memory 200.

Although not illustrated, other combinations of match_addr and read_addr may be used. For example, match_addr may be analog while read_addr is digital (e.g., the matchline 120 of each storage block 110 may be output directly from the CAM 100 to the state transition logic 400, which outputs a digital read_addr based thereon). As another example, match_addr may be digital while read_addr is analog (e.g., each storage block 210 may have an associated read wiring (not illustrated) that is connected to the state transition logic 400, such that the target storage block 210 is indicated by applying an active signal on its associated read wiring). In such an example, the active signal on the read wiring constitutes read_addr.

The memory 200 may output the state identifier stored in the read storage block 210 to the state transition logic 400. The memory 200 may also generate additional output based on the contents of the read storage block 210; for example, if the read storage block 210 stores an instruction in addition to the state identifier, then the memory 200 may output the instruction. The state transition logic 400 may then update the current state of the FSM 10 to match the state identifier that was output by the memory 200.

Specific examples of the above-described components of the example FSM 10 will be described in greater detail below.

2.1. Example CAM 100

Figure 2:
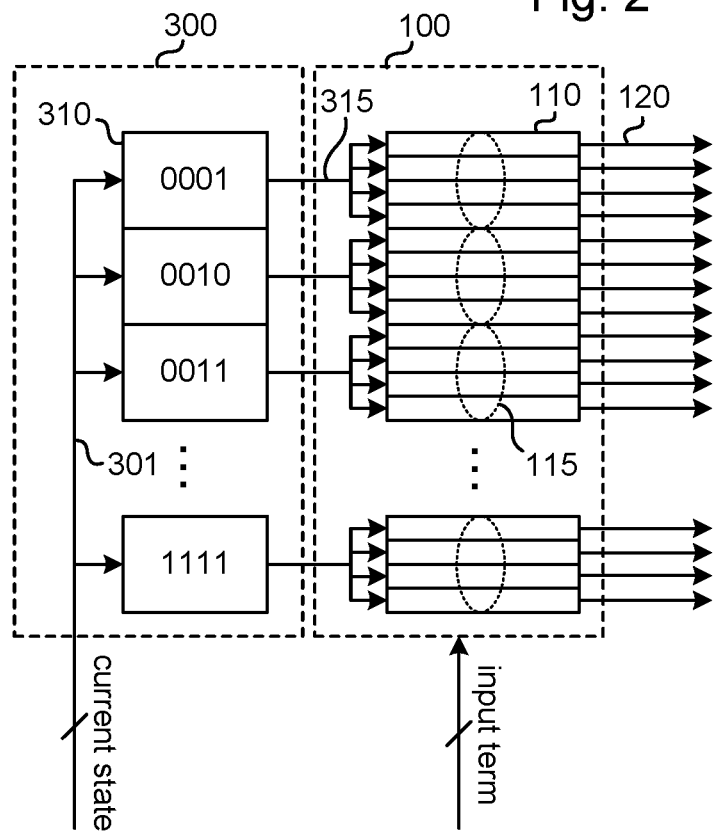
FIG. 2 is a diagram illustrating an example CAM and example search enablement logic that includes group enablement circuits.

The example CAM 100 may include multiple storage blocks 110 (see, e.g., FIG. 2). Each storage block 110 may include a number of bit cells 112 (see, e.g., FIG. 5), which are capable of storing at least binary values (e.g., 1 or 0). Each storage block 110 corresponds to a data word, with each bit cell 112 of the storage block 110 corresponding to a bit-position of the data word. For example, if the first, second, and third bit cells 112 of a storage block 110 store the value "1" and the fourth bit cell 112 of the storage block 110 stores the value "0", then the storage block 110 stores the word "1110".

In the FSM 10, the storage blocks 110 may be used to store input terms of the FSM 10. More specifically, groups 115 of storage blocks 110 may be respectively associated with states of the FSM 10, and each group 115 of storage blocks 110 may store the input terms that are accepted by the FSM 10 for that state. For example, if state "3" of the FSM 10 accepts the terms "b", "c", and "d", then the terms "b", "c", and "d" may be stored in a group 115 of storage blocks 110 that is associated with state "3". Because multiple states of the FSM 10 may accept the same term, some input terms may be stored in multiple of the storage blocks 110; however, in general each input term is stored just once within the same group 115.

Each of the storage blocks 110 has a corresponding matchline 120 (see, e.g., FIG. 2), which indicates during a search operation whether the word stored in the storage block 110 matches a search word. In particular, bit cells 112 that are part of the same storage block 110 are all connected to the same matchline 120 as one another, either in parallel or in series (see, e.g., FIG. 5). In order to search the storage block 110, the CAM 100 may apply voltages to the bit cells 112 based on a search word, such that the value stored in each bit cell 112 of the storage block 110 is compared to the bit of the search word in the same bit position. For example, during a search operation using the search word "1011", the first, third, and fourth bit cells 112 of the storage block 110 may be compared to the value "1", while the second bit cell 112 of the storage block 110 may be compared to the value "0". If the word stored in a storage block 110 matches the search word, then the voltage of the matchline 120 associated with the storage block 110 will be at one level (e.g., high), while if any bit cell 112 of the storage block 110 stores a non-matching value, then voltage of the matchline 120 will be at an opposite level (e.g., low).

For example, in a NOR-type architecture, the bit cells 112 respectively include switches (not illustrated), such as transistors, that are connected in parallel to the corresponding matchline 120. Each of the switches may be connected between a first voltage (e.g., a low voltage) and the matchline 120, such that when the switch is ON (e.g., passing a signal) a current path is formed that connects the matchline 120 to the first voltage. In such an example, the CAM 100 searches a storage block 110 by first precharging the matchline 120 to a second voltage (e.g., a high voltage). Then any bit cell 112 whose stored value does not match the corresponding bit of the search word will turn ON its switch, thus forming a current path to connect the matchline 120 to the first voltage. Thus, if a single bit cell 112 does not store a matching value, then that bit cell 112 will pull the voltage of the matchline 120 to the first voltage (regardless of whether or not the other bit cells 112 match their respective search criteria). Accordingly, the matchline 120 remains at the second voltage only if all of the bit cells 112 store values that match their respective search criteria.

As another example, in a NAND-type architecture, the bit cells 112 may be serially connected to one another, with a last one of the bit cells 112 being connected to the corresponding matchline 120. The bit cells 112 may be configured such that a given bit cell 112 passes an active signal (e.g., high voltage) to its next neighbor if the given bit cell 112: (a) received an active signal either from the previous cell 112 or from a voltage source in the case of the first bit cell 112, and (b) matches its own search criteria. Thus, the last bit cell 112 in the series will output a match signal to the corresponding matchline 120 only if all of the bit cells 112 matched their search criteria. For example, each bit cell 112 may include a switch (not illustrated), such as a transistor, that is turned ON (passes a signal) during a search if the bit cell 112 matches its search criterion. The switches of the bit cells 112 may be connected in series between the second voltage (e.g., a high voltage) and the corresponding matchline 120, such that when all of the switches are ON they form a signal path between the matchline 120 and the second voltage (e.g., a high voltage). In such an example, if a single bit cell 112 does not store a matching value, then the switch of that bit cell 112 will prevent a signal from being passed on to the next bit cell 112 and ultimately to the matchline 120. Accordingly, an active signal is applied to the matchline 120 by the last bit cell 112 only if all of the bit cells 112 store values that match their respective search criteria.

In some examples, the CAM 100 may also include an encoder 130 (not illustrated). The encoder 130 may detect any matchline 120 that indicates a match (e.g., has a high voltage after a search), determine an address of the corresponding storage block 110, and output that address as a digital signal constituting match_addr.

In other examples, such as in the example of FIG. 1B, the matchlines 120 may extend out of the CAM 100 without passing through an encoder, in which case an active signal on one of the matchlines 120 constitutes match_addr.

In some examples in which the CAM 100 is a TCAM, the bit cells 112 may also be capable of storing a wildcard value in addition to the binary values. The bit cells 112 are such that, if they store the wildcard value, then they always indicate a match regardless of the value they are compared to.

2.2. Example Memory 200

The memory 200 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The memory 200 may include storage blocks 210. Each storage block 210 of the memory 200 may correspond to a storage block 110 of the CAM 100, and may be used to store a destination state identifier. The state identifier is referred to herein as a "destination" state identifier because it denotes the next state that the FSM 10 will assume if that storage block 210 is read. In particular, when a storage block 110 of the CAM 100 matches a search, then the corresponding storage block 210 of the memory 200 is read, and the state identifier that is stored therein becomes the next state of the FSM 10. Thus, the destination state identifier that is read from the memory 200 becomes the "current state" for the next input term that is input to the FSM 10.

As noted above, in addition to storing the destination state identifiers, the storage blocks 210 may also store additional information. For example, the storage blocks 210 may store instructions that may be output to a processor for execution.

2.3 Example Search Enablement Logic 300

As mentioned above, the search enablement logic 300 may be configured to select a subset of the storage blocks 110 of the CAM 100 to enable for searching. In particular, the search enablement logic 300 may select the subset based on a current state of the FSM 10. More specifically, each storage block 110 is associated with one of the states of the FSM 10, and the search enablement logic 300 may select those storage blocks 110 that are associated with the current state of the FSM 10. Examples of how the search enablement logic 300 may be able to determine which storage blocks 110 are associated with the current state are described in greater detail in the following sections.

Once the search enablement logic 300 has identified which storage blocks 110 to enable, it may enable the searching of the selected storage blocks 110 by causing a necessary condition of searching to be satisfied for those selected storage blocks 110. For example, the search enablement logic 300 and/or the CAM 100 may include circuitry that prevents any given storage block 110 from being searched if it does not have an active search enable signal (i.e., a storage block 110 having an active search enable signal is a necessary condition for it to be searched). In such examples, the search enablement logic 300 may enable searching of the selected storage blocks by generating active search enable signals for the selected storage blocks 110.

For example, in some examples in which the CAM 100 has a NOR-based architecture, the searching of a storage block 110 requires precharging of its matchline 120. In such examples, the search enablement logic 300 and/or the CAM 100 may include circuitry that prevents a precharging voltage from being generated for or applied to the matchline 120 of any storage block 110 that does not have an active search enable signal. In this way, a storage block 110 having the active search enable signal becomes a necessary condition for it to be searched.

As another example, in some examples in which the CAM 100 has a NAND-based architecture, the searching of a storage block 110 requires the first bit cell 112 in the series of bit cells 112 of the storage block 110 to be connected to the second voltage (e.g., high voltage). In such examples, the search enablement logic 300 and/or the CAM 100 may include circuitry (such as a switch) that prevents the second voltage from being connected to the first bit cell 112 of any storage block 110 that does not have an active search enable signal. In this way, a storage block 110 having the active search enable signal becomes a necessary condition for it to be searched.

The search enablement logic 300 may be any circuitry capable of performing the operations described herein in relation to the search enablement logic 300. For example, the search enablement logic 300 may include dedicated hardware, such as in the detailed examples illustrated in FIGS. 4, 5, and 8 and described below.

As another example, the search enablement logic 300 could include general-purpose processing circuitry that is configured to perform the operations described herein by executing machine readable instructions. In such an example, the processing circuitry constituting the search enablement logic 300 may include any circuitry capable of executing machine-readable instructions, such as a central processing unit (CPU), a microprocessor, a microcontroller device, a digital signal processor (DSP), etc.

2.3.1. Example of Fixed State/Block Associations

FIG. 2 illustrates a first example of the search enablement logic 300 in which the storage blocks 110 of the CAM 100 are fixedly associated with states of the FSM 10. In this example, the search enablement logic 300 includes group enablement circuits 310. Each of the group enablement circuits 310 is associated with a particular state of the FSM 10; for example, in FIGS. 2 and 3, the state with which a group enablement circuit 310 is associated is indicated as a binary number within the box that represents the group enablement circuit 310. In addition, each of the group enablement circuits 310 is to control search enablement for a corresponding group 115 of multiple storage blocks 110 of the CAM 100; for example, in FIGS. 2 and 3 each group enablement circuit 310 is associated with a group 115 comprising four storage blocks 110. Specifically, a given group enablement circuit 310 is to control whether searching is enabled for its group 115 of storage blocks 110 based on whether the current state of the FSM 10 matches the state that is associated with the group enablement circuit 115.

For example, a group enablement circuit 310 may control search enablement of its corresponding group 115 by outputting a search enable signal to corresponding wiring lines 315. In the example of CAM 100 with a NOR-architecture, the wiring lines 315 may be connected to a precharging circuit (not illustrated) of each storage block 110 in its corresponding group 115, which allows precharging for its storage block 110 only when the search enable signal is asserted on the wiring line 315. In the example of CAM 100 with a NAND-architecture, the wiring lines 315 may be connected to a switch (not illustrated) of each storage block 110 in its corresponding group 115, which connects the first bit cell 112 of the storage block to the second voltage only when the search enable signal is asserted on the wiring line 315.

Figure 3:
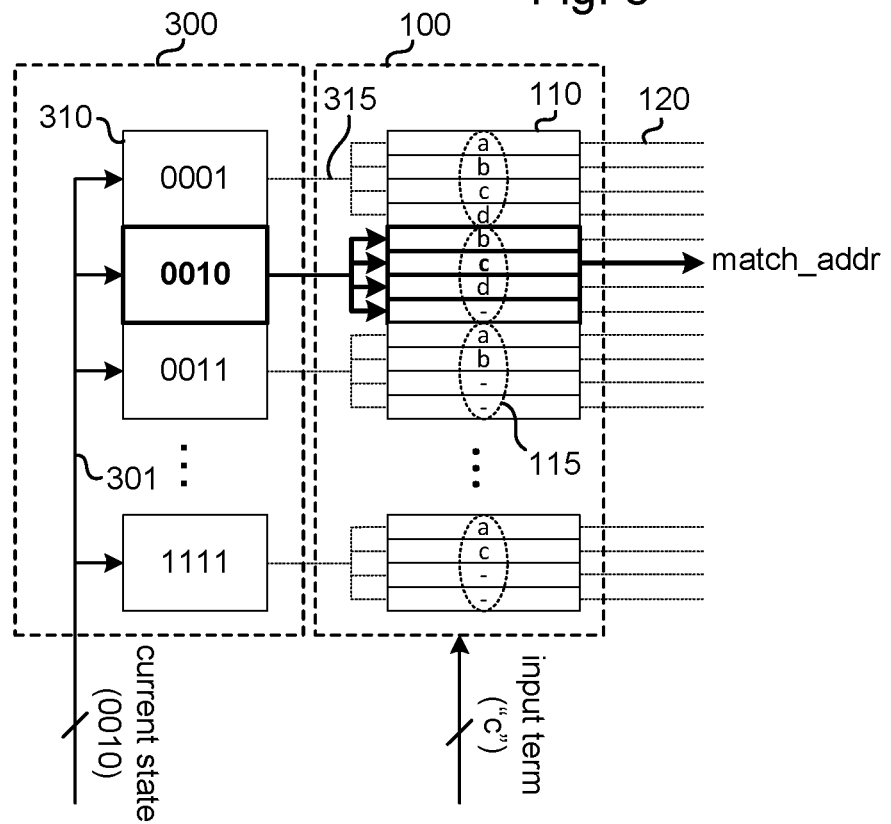
FIG. 3 is a diagram illustrating a specific application example of the example search enablement logic and the example CAM.

For example, in FIG. 3, an example is illustrated in which the current state of the FSM 10 is "0010", various input terms are stored in the storage blocks 110 (indicated in FIG. 3 by letters within the boxes representing the storage blocks 110), and the input search term is "c". In this example, each of the group enablement circuits 310 reads "0010" (i.e., the current state) from the digital bus 301, and decides whether to output an active enable signal based on whether "0010" matches the state that is associated with the group enablement circuit 310. In FIG. 3 the group enablement circuit 310 whose associated state matches the current state is indicated by a thick lined rectangle, and this group enablement circuit 310 outputs a search enable signal for each storage block 110 in its associated group 115, while the other group enablement circuits 310 do not output search enable signals. In FIG. 3, the wiring lines 315 carrying active search enable signals are indicated by thick lines, while the wiring lines 315 not carrying active search enable signals are indicated by dashed lines. The enabled storage blocks 110 are searched based on "c" (i.e., the input term), while the remaining blocks 110 of the CAM 100 are not searched. In FIG. 3, the storage blocks 110 that are searched are indicated by thick lined rectangles. The storage block 110 within the searched group 115 that stores the term "c" indicates a match on its matchline 120. In FIG. 3, the matchline 120 indicating a match is indicated by a thick line, while the matchlines 120 that do not indicate a match are indicated by dashed lines. In the example illustrated in FIG. 3, the indication of the match on the matchline 120 is output directly from the CAM 100 as match_addr. In other examples (not illustrated), the indication of the match on the matchline 120 may be encoded into a digital value corresponding to the address of the matching storage block 110 (i.e., "00110"), which is then output from the CAM 100.

Although FIGS. 2 and 3 illustrate examples in which there are fifteen group enablement circuits 310 and four storage blocks 110 per group 115, these numbers are used merely for convenience of illustration and description. In practice, any number of group enablement circuits 310 may be included. In addition, any number of storage blocks 110 may be included in each group 115, and the number of storage blocks 110 does not have to be the same from one group 115 to the next.

In some example FSMs 10 that use the example search enablement logic 300 of FIGS. 2 and 3, the maximum number of states that the FSM 10 may have is equal to the number of group enablement circuits 310. Accordingly, in some circumstances it may be desired to include at least as many group enablement circuits 310 as the anticipated number of FSM states. Similarly, in some example FSMs 10 that use the example search enablement logic 300 of FIGS. 2 and 3, the maximum number of input terms that can be accepted by any given state of the FSM 10 may be equal to the number of storage blocks 110 in the group 115 associated with that state. Accordingly, in some circumstances it may be desired to include at least as many storage blocks 110 in each group 115 as are anticipated to be needed by the states of the FSM 10. In examples in which the states and input terms of the FSM 10 are known and the FSM 10 is not intended to be reprogrammed, the numbers of group enablement circuits 310 and storage blocks 110 in each group 115 may be tailored specifically to match the states and input terms of the FSM 10. In examples in which the FSM 10 is to be a general-purpose or reprogrammable FSM, then it may be desirable, in some circumstances, to include the same number of storage blocks 110 per group 115, since it might not be known in advance how many search terms will need to be associated with each state.

Figure 4:
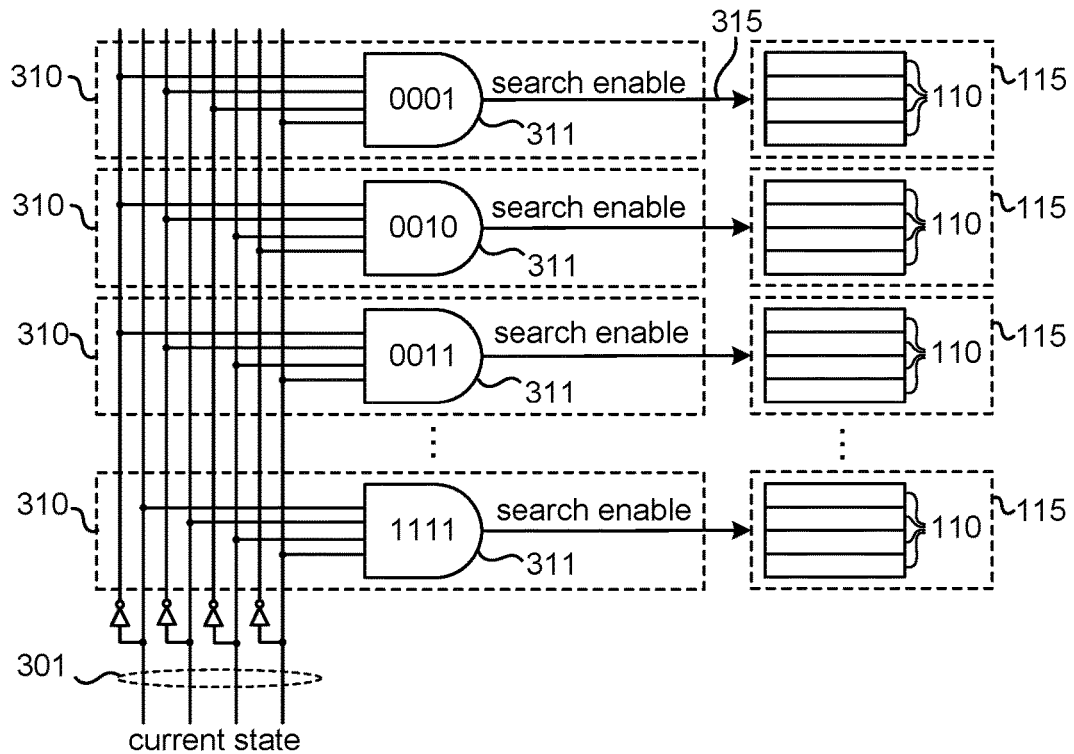
FIG. 4 is a diagram illustrating example details of the example group enablement circuits.

FIG. 4 illustrates one possible example of how a group enablement circuit 310 may be constituted. In the example of FIG. 4, each group enablement circuit 310 comprises an AND gate 311 that has its inputs connected to a digital bus 301 that carries a digital value representing the current state, and whose output is a search enable signal for a group 115 of storage blocks 110. Each of the AND gates 311 may have the same number of inputs as the word size of the digital bus 301, which number is designated "N" herein. In FIG. 4, a four-bit example (i.e., N=4) is shown for simplicity, but in practice any word size that is sufficient to encode all of the states of the FSM 10 may be used. The inputs of each AND gate 311 may be connected to the bus 301 in such a manner as to cause the AND gate 311 to function as a digital comparator that compares the value of the digital bus to a specific number, which is the FSM state that the group enablement circuit 310 is associated with. In such an example, the AND gate 311 will output a logic 1 only when the current state is the same as the state that the group enablement circuit 310 is associated with. In particular, such a comparator may be formed by connecting each input of the AND gate 311 to either an inverted or non-inverted signal of a corresponding bit of the digital bus 301 based on the corresponding state number. Specifically, each AND gate 311 may be connected to the digital bus 301 based on its corresponding state number as follows: for each value of n={1, 2, . . . , N}, if the $n^{th}$ bit of the state number is "0" then connect the $n^{th}$ input of the AND gate 311 to the inverted signal of the $n^{th}$ bit of the digital bus 301, and if the $n^{th}$ bit of the state number is "1" then connect the $n^{th}$ input of the AND gate 311 to the non-inverted signal of the $n^{th}$ bit of the digital bus 301. Thus, for example, an AND gate 311 that is associated with the number "0001" may be formed by connecting its first three inputs to an inverted signal of the first three bits of the bus 301, respectively, and connecting its fourth input to the non-inverted fourth bit of the bus 301, as illustrated in FIG. 4.

The search enable signal that is output by a group enablement circuit 310 controls whether searching of the storage blocks 110 of its group 115 is enabled in the sense that none of the storage blocks 110 in its group 115 can be searched if the search enable signal is not active (e.g., logic 1). However, just because the search enable signal is active for a given group 115, this does not necessarily mean that all (or any) of the enabled storage blocks 110 will actually be searched. For example, it is possible for searching of a storage block 110 to be contingent on both the search enable signal and additional conditions. For example, the search enable signal may be logically conjoined (AND-ed) with another signal, and the result may control search enablement of the entire group 115 or of individual storage blocks 110 therein, such that searching is enabled for the group 115 or individual blocks 110 only when both signals are active.

More specifically, references herein to something controlling whether searching is enabled should be understood to mean that the thing (e.g., the search enable signal) is at least a necessary condition for searching of the group 115, but should not be misunderstood to mean that the thing is necessarily a sufficient condition of searching of the group 115.

Figure 5:
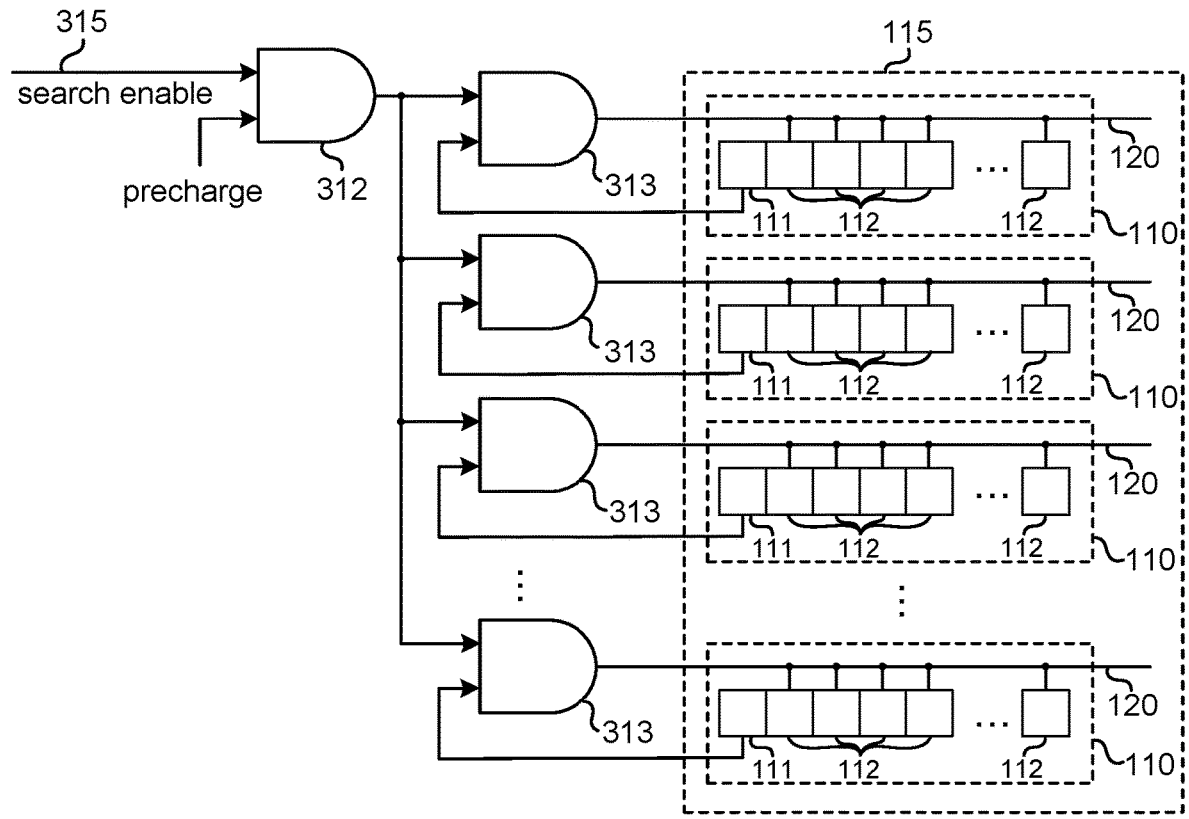
FIG. 5 is a diagram illustrating additional examples details of the example search enablement logic and the example CAM.

For example, FIG. 5 illustrates additional enablement logic that may further control, in conjunction with the search enable signal, whether any or all of storage blocks 110 in a group 115 can be searched. In the example of FIG. 5, each group 115 may have an associated precharge control circuit 312 and multiple individual enablement circuits 313.

The precharge control circuit 312 may be constituted by an AND logic gate that performs logical conjunction on the search enable signal output by the group enablement circuit 310 and a precharge signal, and the output of the precharge control circuit 312 may control whether any of the matchlines 120 of the group 115 may be precharged. Thus, in this example, searching is enabled for storage blocks in the group 115 only if the search enable signal and the precharge signal are both active (logical 1) at the same time. The precharge control circuit 312 may be included to ensure that precharging of matchlines 120 occurs only at desired timings, such as immediately prior to a search operation.

The individual enablement circuits 313 may each be associated with one of the storage blocks 110 of the group 115, and may control whether that individual storage block 110 is enabled for searching. In the example of FIG. 5, each individual enablement circuit 313 controls whether its storage block 110 is enabled for searching based on (1) the output of the precharge control circuit 312, and (2) whether a special bit 111 associated with the storage block 110 is set. In particular, if the special bit 111 is set (e.g., stores a "1"), then searching of the storage block 110 may be enabled (assuming other conditions, such as the search enable signal being on, are met), while if the special bit 111 is not set (e.g., stores a "0"), then searching of the storage block 110 may be disabled (regardless of whether the other conditions are met). For example, each individual enablement circuit 313 may be constituted by an AND logic gate with one input connected to a readout node of the special bit 111 of the corresponding storage block 110 and a second input connected to the output of the precharge control circuit 312. The special bit 111 may be configured such that, at least during a search operation, its readout node outputs a logic 1 when the bit 111 is set and outputs a logic 0 when the bit 111 is not set.

The use of such individual enablement circuits 313 may allow more fine-grained control of which storage blocks 110 are enabled. For example, the FSM 10 and/or a user thereof may prevent individual storage blocks 110 from being searched by not setting its special bit 111. For example, the FSM 10 may be configured to set the special bit 111 of any storage block 110 that stores an input term, but to not set the special bit 111 of any storage block 110 that is empty. This may be beneficial, for example, because it may save even more power by preventing the wasteful searching of storage blocks 110 that do not store any input terms. For example, in some example FSMs 10, it may be possible for an FSM state to have more storage blocks 110 associated with it than are needed to store the valid inputs for that state, which means that there will be some unused storage blocks 110 for that state. For example, suppose that every state is allocated 64 storage blocks 110 and that a given FSM state has only 23 valid inputs, then in this example there will be 41 storage blocks in the group 115 associated with the given state that do not store anything.

Although FIG. 5 focuses on an example using a NOR-type CAM architecture, the same principles apply to a NAND-type architecture mutatis mutandis. For example, in a NAND-type architecture, instead of the outputs of the AND gates 313 being connected to the matchlines 120, they each could be connected to the first bit cell 112 of their corresponding storage block 110 as the source of the second voltage. In such examples, the second voltage is applied to the first bit cell 112 when the corresponding AND gate 313 outputs logical 1. As another example, in a NAND-type architecture, instead of the outputs of the AND gates 313 being connected to the matchlines 120, they each could be connected to a switch (e.g., transistor) that is interposed between a voltage source carrying the second voltage and the first bit cell 112, such that the switch is turned ON (e.g., passes a signal) when the AND gate 313 outputs logical 1.

2.3.2. Example of Changeable State/Block Associations

In a second example of the search enablement logic 300, the storage blocks 110 of the CAM are changeably associated with states of the FSM 10. For example, the search enablement logic 300 may select a subset of storage blocks 110 to enable for searching by identifying a range of block-addresses that are associated with a current state of the FSM and enabling searching of only those blocks 110 of the CAM 100 whose respective block-addresses are within the identified range. The search enablement logic 300 may identify the range of block-addresses that are associated with the current FSM state by consulting a record that associates block-addresses with FSM states, such as a look up table (LUT). The association between block-addresses and FSM states may be changeable in the record, thus allowing the storage blocks 110 to be dynamically allocated and reallocated amongst FSM states.

Figure 6:
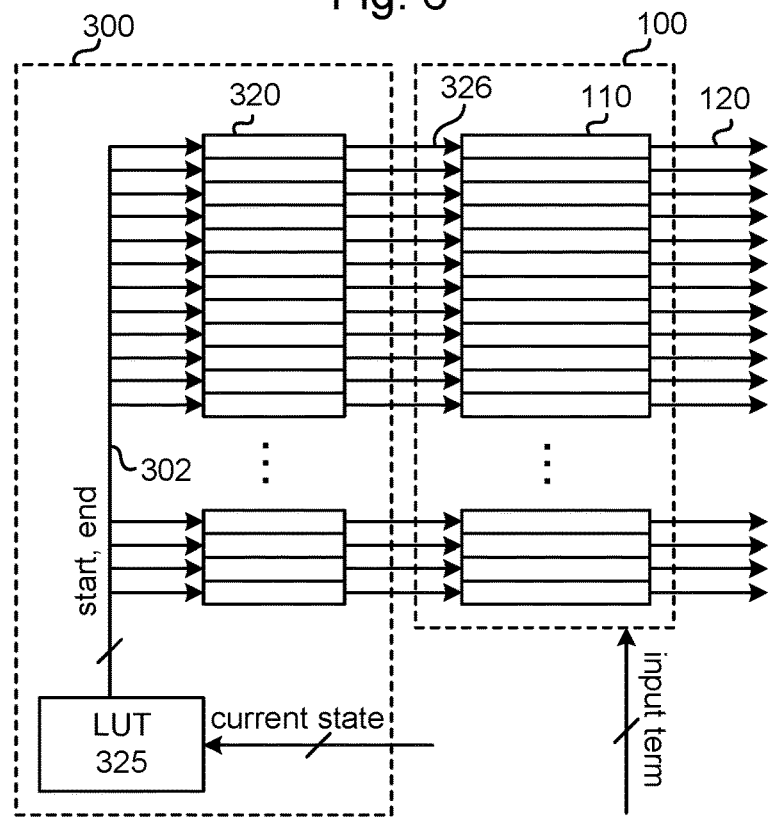
FIG. 6 is a diagram illustrating an example CAM and second example search enablement logic that includes individual enablement circuits.

For example, as illustrated in FIG. 6, the search enablement logic 300 may include individual enablement circuits 320, with each being associated with one storage block 110 of the CAM 100. Each of the individual enablement circuits 320 is to control search enablement for its corresponding storage block 110. For example, an individual enablement circuit 320 may control search enablement of its corresponding storage block 110 by outputting a search enable signal to a corresponding wiring line 326. The wiring line 326 may be connected to circuitry (not illustrated) (such as a precharge circuit or switch) associated with the corresponding storage block 110 that allows searching of its storage block 110 only when the search enable signal is asserted on the wiring line 326.

The search enablement logic 300 may further include an LUT 325, which associates ranges of block-addresses of storage blocks 110 with states of the FSM 10. The current FSM state may be input to the LUT 325, and in response the LUT 325 may look up the range of addresses that is associated with the current state and output an indication of the range, such as the first and last block-address of the range. The individual enablement circuits 320 may each determine whether or not to enable their storage block based on the range of block-addresses output by the LUT 325. Specifically, an individual enablement circuit 310 may enable its storage block 110 if only its block-address is within the identified range.

Figure 7:
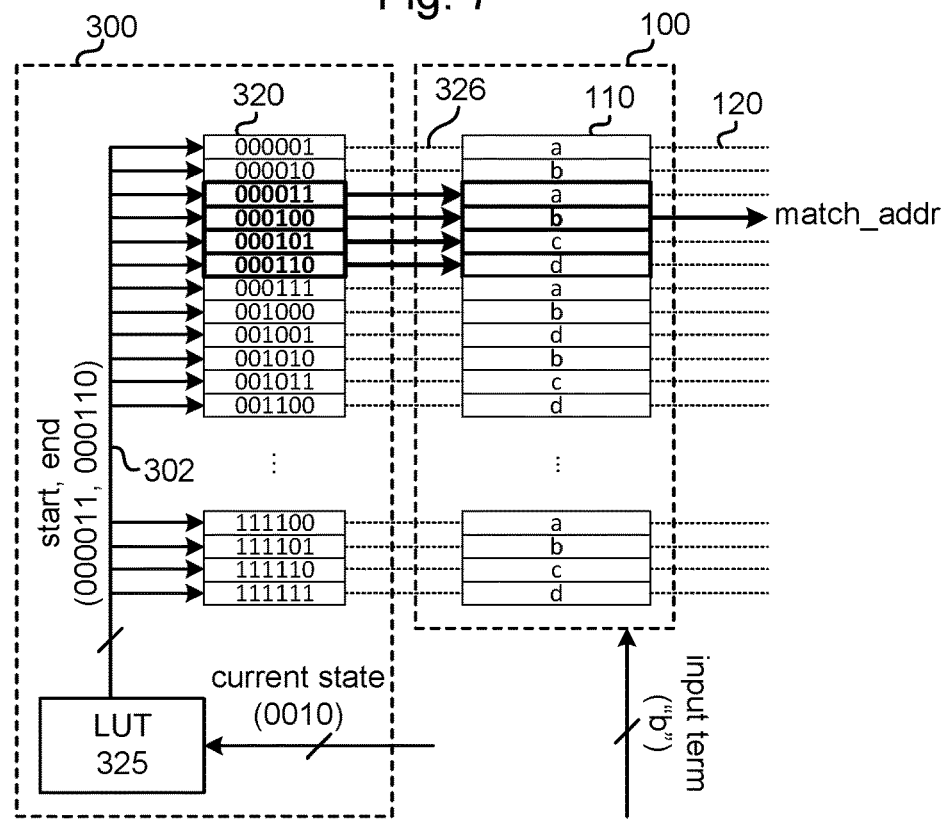
FIG. 7 is a diagram illustrating a specific application example of the second example search enablement logic and the example CAM.

For example, in FIG. 7, an example is illustrated in which the current state of the FSM 10 is "0010", various input terms are stored in the storage blocks 110 (indicated in FIG. 7 by letters within the boxes representing the storage blocks 110), and the input search term is "b". In this example, the LUT 325 looks up "0010" (i.e., the current state), and outputs "000011" and "000110" (i.e., the start and end block-addresses of the range that is associated with the state "0010" in the LUT 325). Each of the individual enablement circuits 320 reads "000011" and "000110" (i.e., the start and end block addresses) from the digital bus 302, and decides whether to output an enable signal based on whether the block address of its associated storage block 110 is within the range indicated by the read numbers. In FIG. 7 the individual enablement circuits 320 whose associated block addresses are within the range output by the LUT 325 are indicated by a thick lined rectangle, and each of these individual enablement circuits 320 outputs a search enable signal for its corresponding storage block 110, while the other individual enablement circuits 320 do not output any enable signals. In FIG. 7, the wiring lines 326 carrying active search enable signals are indicated by thick lines, while the wiring lines 326 not carrying active search enable signals are indicated by dashed lines. The enabled storage blocks 110 are searched based on "b" (i.e., the input term), while the remaining blocks 110 of the CAM 100 are not searched. In FIG. 7, the storage blocks 110 that are searched are indicated by the thick lined rectangles. The storage block 110 among the searched storage blocks 110 that stores the term "b" indicates a match on its matchline 120. In FIG. 7, the matchline 120 indicating a match is indicated by a thick line, while the matchlines 120 that do not indicate a match are indicated by dashed lines. In the example illustrated in FIG. 7, the indication of the match on the matchline 120 is output directly from the CAM 100 as match_addr. In other examples (not illustrated), the indication of the match on the matchline 120 may be encoded into a digital value corresponding to the address of the matching storage block 110 (i.e., "000100"), which is then output from the CAM 100.

Although FIGS. 6 and 7 illustrate examples in which there are 63 individual enablement circuits 320 and storage blocks 110, these numbers are used merely for convenience of illustration and description. In practice, any number of individual enablement circuits 320 and storage blocks 110 may be included.

Figure 8:
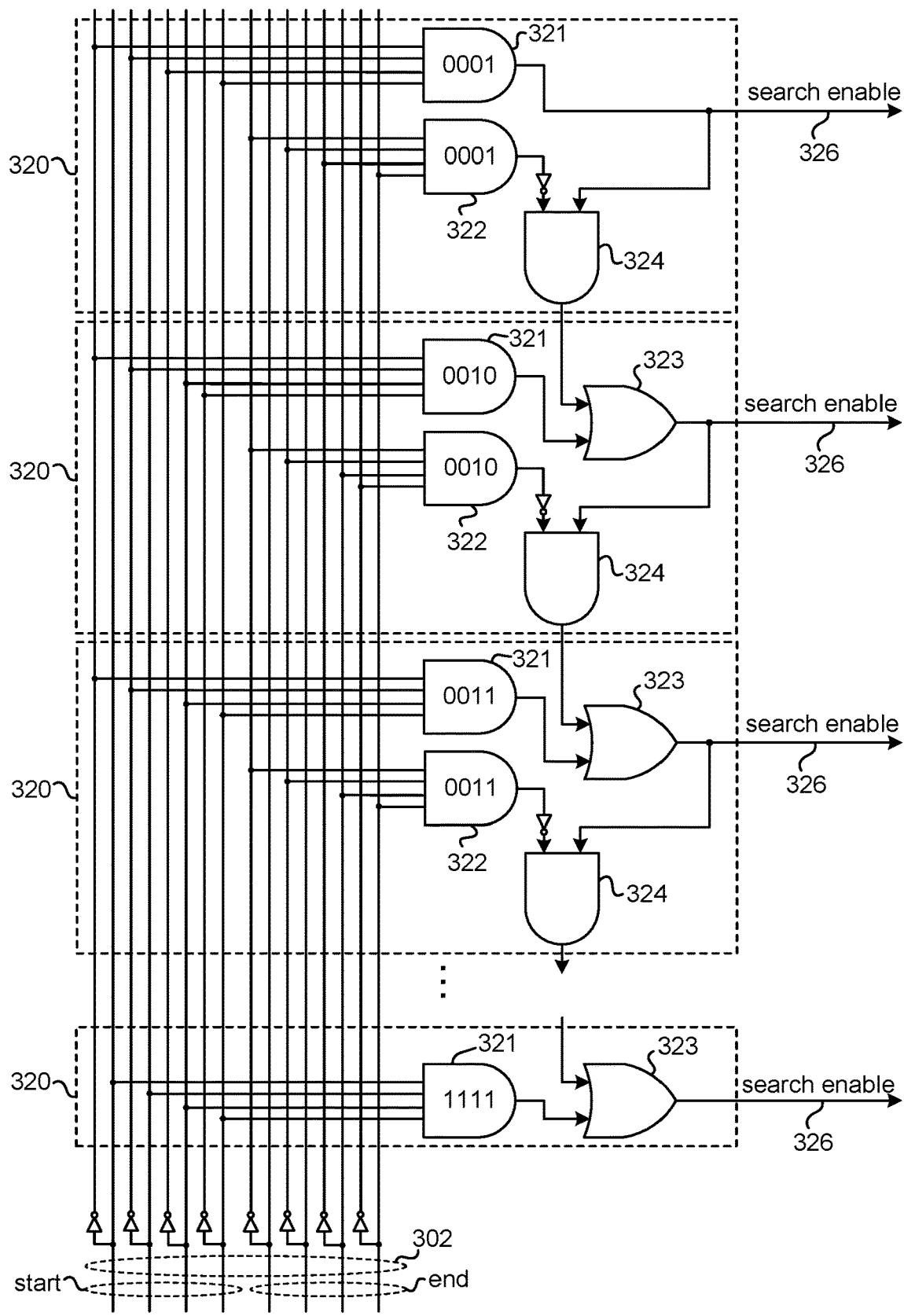
FIG. 8 is a diagram illustrating example details of the example individual enablement circuits.

FIG. 8 illustrates one example of how the individual enablement circuits 320 may be constituted. The individual enablement circuits 320 illustrated in FIG. 8 are configured to output a search enable signal if any of the following conditions are satisfied: (A) their associated block address matches the start address carried on the digital bus 302, (B) their associated block address matches the end address carried on the digital bus 302, or (C) their associated block address is between the start and end addresses carried on the digital bus 302. More specifically, each of the individual enablement circuits 320, with a few exceptions, may include: (i) a start AND gate 321 whose inputs are connected to the bits of the digital bus 302 that carry the start block address, (ii) an end AND gate 322 whose inputs are connected to the bits of the digital bus 302 that carry the end block address, (iii) an AND gate 324, and (iv) an OR gate 323 whose output is the wiring line 326. The inputs of the AND gate 324 are connected to an inverted output of the end AND gate 322 and to the wiring line 326. The output of the AND gate 324 is passed to a next individual enablement circuit 320. The inputs of the OR gate 323 are connected to the output of the start AND gate 321 and the output of the AND gate 324 of the previous individual enablement circuit 320. The first one of the individual enablement circuits 320 may omit the OR gate 323, and the corresponding wiring line 326 may be connected to the output of the start AND gate 321 instead. The last one of the individual enablement circuits 320 may omit the AND gate 324 and the end AND gate 322. Additional details pertaining to these elements are described in greater detail below.

For each individual enablement circuit 320, the start and end AND gates 321, 322 may have their inputs connected to the digital bus 302 so as to cause the AND gates 321, 322 to act as digital comparators comparing the start and end addresses, respectively, to the individual enablement circuit 320's block address. Thus, for example, the start AND gate 321 of the first individual enablement circuit 320 is connected to the start address bits of the bus 302 so as to cause the start AND gate 321 to compare the start address on the bus 302 to the block address associated with the first individual enablement circuit 320 (which is "0001" in FIG. 8). Thus, the start AND gate 321 outputs a logical 1 if and only if the start address carried on the bus 302 matches the block address associated with the individual enablement circuit 320, while the end AND gate 322 outputs a logical 1 if and only if the end value carried on the bus 302 matches the block address associated with the individual enablement circuit 320.

The start AND gates 321 described above ensure that the individual enablement circuit 320 that matches the start address will output a search enable signal. In particular, because the output of the start AND gate 321 is an input of the OR gate 323, the individual enablement circuit 320 will output an active (e.g., logical 1) search enable signal if the start address on the digital bus 302 matches its block address.

As for individual enablement circuits 320 whose block addresses equal the end address or are between the start and end addresses, these individual enablement circuits 320 may be caused to output active search enable signals via the AND gates 324. As noted above, the output of the AND gate 324 is passed down to the next individual enablement circuit 320 as an input of the OR gate 323 of the next circuit 320. Thus, an individual enablement circuit 320 will output an active search enable signal if the AND gate 324 of the previous individual enablement circuit 320 is outputting an active search enable signal. Furthermore, the AND gate 324 of a given individual enablement circuit 320 is configured such that it will output a logical 1 if and only if (1) the given individual enablement circuit 320 is outputting an active search enable signal, and (2) the block address of the given individual enablement circuit 320 does not match the end address. Accordingly, any individual enablement circuit 320 will output an active search enable signal if the previous individual enablement circuit 320 is also outputting an active search enable signal, unless the block address of the previous individual enablement circuit 320 happens to match the end address. This results in all of the individual enablement circuits 320 whose block addresses are between the start and end addresses (inclusive of the end address) outputting active search enable signals, while any individual enablement circuit 320 whose block address is outside the range (i.e., prior to the start address or subsequent to the end address) does not output an active search enable signal.

To see how the above-described configuration results in the correct individual enablement circuits 320 outputting search enable signals, consider an example in which the start address output on the bus 302 is "0011" (i.e., 3) and the end address output on the bus 302 is "0101" (i.e., 5). In this example, the third individual enablement circuit 320 whose block address is "0011" will output a search enable signal because its block address matches the start address (i.e., its start AND circuit 321 outputs logical 1, causing its OR gate 323 to output logical 1). This is precisely the desired result, since the block address of the third circuit 320 ("0011") is within the range [0011, 0101]. Furthermore, the AND gate 324 of the third individual enablement circuit 320 will output logical 1, since its OR gate 323 is outputting logical 1 and its end AND gate 322 is outputting logical 0.

To further the above example, the fourth individual enablement circuit 320 whose block address is "0100" will also output a search enable signal, even though its block address does not match the start address, because the AND gate 324 of the previous circuit 320 (i.e., the third circuit 320) is outputting logical 1. This is precisely the desired result, since the block address of the fourth circuit 320 ("0100") is within the range [0011, 0101]. Furthermore, the AND gate 324 of the fourth individual enablement circuit 320 will output logical 1, since its OR gate 323 is outputting logical 1 and its end AND gate 322 is outputting logical 0.

To further the above example, the fifth individual enablement circuit 320 whose block address is "0101" will also output a search enable signal because the OR gate 323 of the previous circuit 320 (i.e., the fourth circuit 320) is outputting logical 1. This is precisely the desired result, since the block address of the fifth circuit 320 ("0101") is within the range [0011, 0101]. However, unlike with the previous two circuits 320, the AND gate 324 of the fifth individual enablement circuit 320 does not output a logical 1, because the block address of the fifth individual enablement circuit 320 matches the end address (i.e., its end AND gate 322 outputs logical 1).

To further the above example, the first, second, and sixth or greater individual enablement circuits 320 all will not output a search enable signal, because (A) their respective block addresses do not match the start address (i.e., their respective start AND gates 321 output logic 0), and (B) none of these individual enablement circuits 320 have a previous circuit 320 whose AND gate 324 is outputting logical 1. This is precisely the desired result, since none of the block addresses of the first circuit 320 ("0001"), second circuit ("0010"), and sixth or subsequent circuits 320 ("0110", . . . ) are within the range [0011, 0101].

One benefit of example FSMs 10 that use changeable association between FSM states and CAM storage blocks 110, such as the example illustrated in FIGS. 6 and 7, is that these FSMs 10 may have more efficient utilization of their CAM blocks 110 than example FSMs 10 that use fixed associations between CAM blocks 110 and FSM states. In particular, in some fixed association FSMs 10, some FSM states may have reserved for them more storage blocks 110 than they need to store the valid inputs for that state, which can result in wasted storage blocks. In contrast, in example FSMs 10 that use changeable association between FSM states and CAM storage blocks 110, such as the example illustrated in FIGS. 6 and 7, each state may be associated with exactly enough CAM blocks 110 to store its valid input terms and no empty storage blocks 110 are reserved for that state. Thus, in some circumstances, the FSM states may be more densely packed in the CAM 100 of a changeable-association FSM 10, allowing the CAM 100 to be smaller overall than the CAM 100 of a fixed-association FSM 10.

Another benefit of example FSMs 10 that use changeable association between FSM states and CAM storage blocks 110 is that they may be more easily able to accommodate states that have large numbers of valid inputs. In particular, in changeable-association FSMs 10 the number of inputs that can be included in a state is limited only by the overall number of storage blocks 110 in the CAM 100. In contrast, in some fixed-association FSMs 10, each state has the same number of storage blocks 110 associated with it, and therefore no state may have more valid inputs than this number. (In this discussion, it is assumed for convenience that a wildcard input term counts as a single input term, even though in practice it may "match" multiple distinct searches).

Another benefit of example FSMs 10 that use changeable association between FSM states and CAM storage blocks 110 is that they may be more easily reprogrammed to change the operation of the FSM 10. Although fixed-association FSMs 10 may be reprogrammable—for example one can change the input terms stored in the CAM 100—but the reprogrammability of such FSMs 10 may be limited in some circumstances by the fixed associations between state and the number of storage blocks 110. For example, if the second state is fixedly associated with eight storage blocks 110, then it might not be possible to reprogram the FSM 10 to include ten valid inputs for the second state; in contrast, in example FSMs 10 that use changeable association between FSM states and CAM storage blocks 110, there is nothing in principle that would prevent such a reprogramming, since the storage blocks 110 can be reallocated.

However, one benefit of example FSMs 10 that use fixed associations between FSM states and CAM storage blocks 110, such as the FSMs 10 illustrated in FIGS. 2 and 3, is that they may be simpler and cheaper to construct than example FSMs 10 that use changeable associations between FSM states and CAM storage blocks 110. For example, the number of group enablement circuits 310 in the example of FIG. 2 is going to be less than the number of individual enablement circuits 320 included in the example of FIG. 6, resulting in less complexity and lower cost for the fixed association FSM 10. As another example, the group enablement circuit 310 in the example of FIG. 4 may be less complex than the example individual enablement circuit 320 in FIG. 8, resulting in less complexity and lower cost for the fixed association FSM 10. As another example, the digital bus 301 of the example of FIG. 2 may have a smaller word-width than the digital bus 302 of the example of FIG. 6, resulting in less complexity and lower cost for the fixed association FSM 10. As another example, the search enablement circuit 310 of FIG. 2 does not need an LUT or other record, while the search enablement circuit 310 of FIG. 6 does, resulting in less complexity and lower cost for the fixed association FSM 10.

In other words, the fixed-association FSMs 10 of FIGS. 2-5 may be less complex, while the changeable-association FSMs 10 of FIGS. 6-8 may be more flexibly reprogrammable and CAM-space-efficient.

2.4. Example State Transition Logic 400

The state transition logic 400 may be configured to, for each received input: feed the received input to the CAM 100 as a search term, and determine a next state of the FSM 10 based on a destination-state identifier read from the memory 200. After identifying the next state, the state transition logic 400 may update its current state output to be the destination-state identifier read from the memory 200. The state transition logic 400 may also output the destination state identifier to a controller (not illustrated) of the FSM 10, which may be part of the FSM 10 or external to the FSM 10 (such as, for example, the processing circuitry 510 illustrated in FIG. 12). In some examples, such as the example of FIG. 1A, the state translation logic 400 may also generate the target read address (read_addr) for the memory 200 based on an output from the CAM 100.

Figure 9:
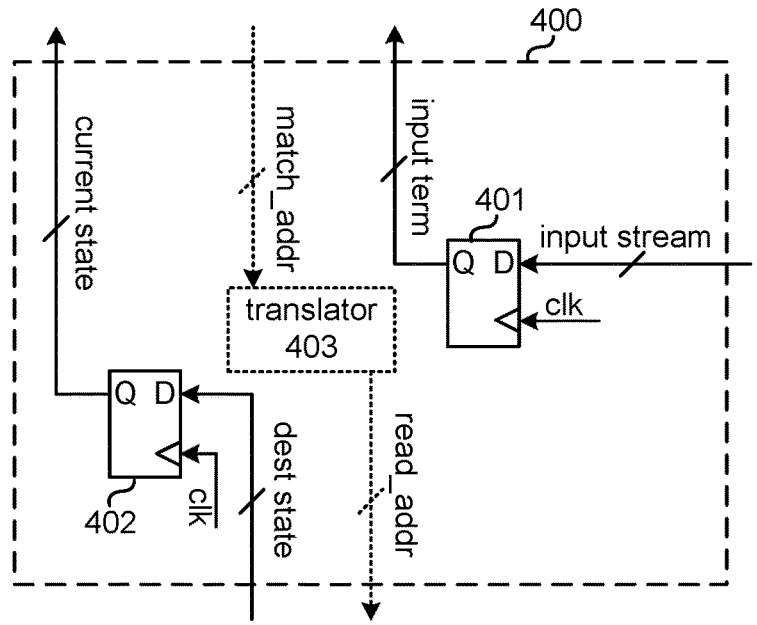
FIG. 9 is a diagram illustrating example state transition logic.

FIG. 9 illustrates one example of how the state transition logic 400 may be constituted. The state transition logic 400 may include a first register 401 and a second register 402. In some examples, such as the example of FIG. 1A, the state transition logic 400 may also include a translator 403. In FIG. 9, the translator 403 is illustrated with dotted lines to emphasize that it is not necessarily included in every example of the state transition logic 400.

The first register 401 may have the input stream applied to its input terminals. The first register 401 may output input terms of the input stream, which are then fed to the CAM 100 as search terms. For example, each input term of the input stream may be successively output from the first register 401 based on a clock signal clk, with one input term being output per clock cycle. In some examples, one purpose of the first register 401 may be to ensure that the input terms are fed to the CAM 100 at desired timings, since the timings at which the input terms are received by the FSM 10 may not always align with desired timings. In some examples, the first register 401 may receive and/or store multiple input terms at a time, and then output the input terms one at a time.

In some examples in which the timings of input terms in the input stream already align with desired timings, the first register 401 may be omitted. In such examples, the input stream may be fed directly into the CAM 100.

The second register 402 may receive the destination state identifier that is read from the memory 200. Upon a next clock cycle beginning, the second register 402 may then output the received destination state identifier to the search enablement logic 300 as the current state.

In some examples, the translator 403 is to receive match_addr (the identification of the matching storage block 110 that is output from the CAM 100) and, based thereon, output read_addr (the identification of the target storage block 210 that is to be read). In FIG. 9, an example is illustrated in which match_addr and read_addr are both digital signals that encode block addresses. However, as noted above, match_addr and read_addr may be any combination of digital and analog signals.

For example, if match_addr and read_addr are both digital signals that encode block addresses, the translator 403 may comprise circuitry that associates CAM 100 block addresses with corresponding memory 200 block addresses (or ranges of block addresses). For example, the translator 403 may comprise an LUT (not illustrated) that associates block addresses of the CAM 100 with block addresses of the memory 200, and the LUT may be searched based on match_addr to determine read_addr.

As another example, if match_addr is an analog signal asserted on one of the matchlines 120 and read_addr is a digital signal that encodes a block address, then translator 403 may comprise circuitry that associates matchlines 120 with corresponding memory 200 block addresses (or ranges of block addresses), such as an encoder.

Furthermore, as noted above, in some examples match_addr and read_addr may be identical, in which case the translator 403 may be omitted, and match_addr may be passed directly to the memory 200 as read_addr. For example, as illustrated in FIG. 1B, each matchline 120 may be connected directly to the memory 200 and correspond to one of the storage blocks 210 such that a given storage block 210 is identified as the read target when its corresponding matchline 120 carries an active signal.

Figure 10:
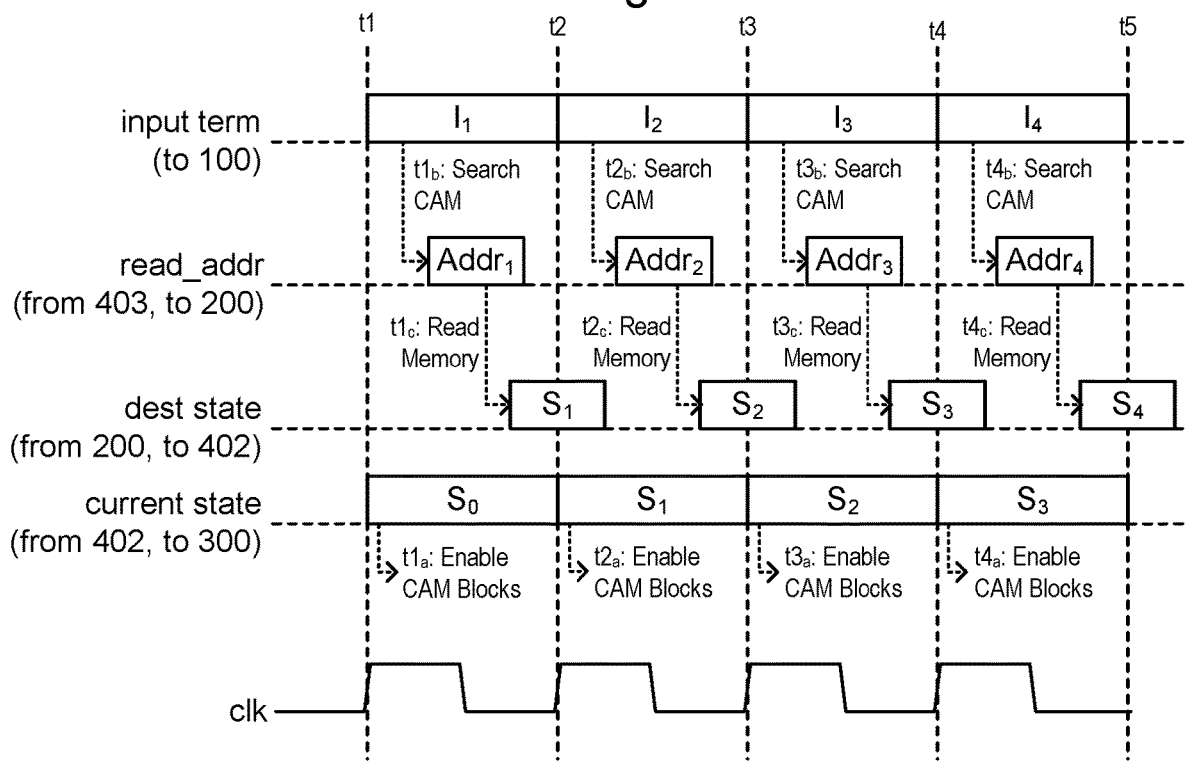
FIG. 10 is a signal timing diagram, illustrating signals and operations of the FSM.

FIG. 10 illustrates example operations of the example state transition logic 400 of FIG. 9. In FIG. 10, the inputs and/or outputs of various structures are shown across time. FIG. 10 is included to aid understanding, but is not intended to accurately represent the exact timings at which signals start and/or end relative to one another.

As illustrated in FIG. 10, the input terms $I_1, \ldots, I_4$ are serially input to the CAM 100 as search terms, one per clock cycle. After the clock cycle begins, the search enablement logic 300 enables a subset of storage blocks 110 based on the current state being output by the register 402. Specifically, in the $n^{th}$ clock cycle the search enablement logic 300 enables the subset of blocks 110 at a timing $tn_a$ based on the current state $S_{n-1}$.

Subsequently, the enabled storage blocks 110 are searched based on the most recent input term input to the CAM 100. Specifically, for the $n^{th}$ clock cycle, the CAM 100 is searched based on the input term $I_n$ at timing $tn_b$. As a result of the searching of the CAM 100, the CAM 100 outputs match_addr. The match_addr is then translated into a read_addr that is fed to the memory 200 (or match_addr is fed directly to the memory 200 as the read_addr).

Subsequently, the storage block 210 of the memory 200 whose block address matches read_address is read. Specifically, for the $n^{th}$ clock cycle, at timing $tn_c$ the storage block 210 that matches $Addr_n$ is read, where $Addr_n$ is the read_address that results from searching the CAM 100 based on the input term $I_n$. As a result of reading the memory 200, a destination state identifier stored in the read storage block 210 is output to and stored in the second register 402. Specifically, for the $n^{th}$ clock cycle, the destination state identifier $S_n$ is output to the second register 402.

In some examples, the timing at which the memory 200 is read is coordinated such that the destination state is being asserted on the inputs of the second register 402 at least when the next clock cycle begins, so that the second register 402 will store the destination state. For example, in FIG. 10, the destination state identifier $S_n$ is asserted at the inputs of second register 402 from some timing after $tn_c$ until at least tn+1. Thus, for the $n^{th}$ clock cycle, the current state that is output by the second register 402 is $S_{n-1}$ (i.e., the destination state from the previous clock cycle).

In some examples, the destination state may be buffered before being input to the second register 402 at the start of the next clock cycle.

In some examples, the second register 402 may receive an enable signal that coincides with the outputting of the destination state from the memory 200, rather than a clock signal clk.

In the example, described above, the dedicated hardware is used for the state transition logic 400. However, in other examples, the state transition logic 400 could be formed by general purpose processing circuitry executing machine readable instructions.

3. Example Method

Figure 11:
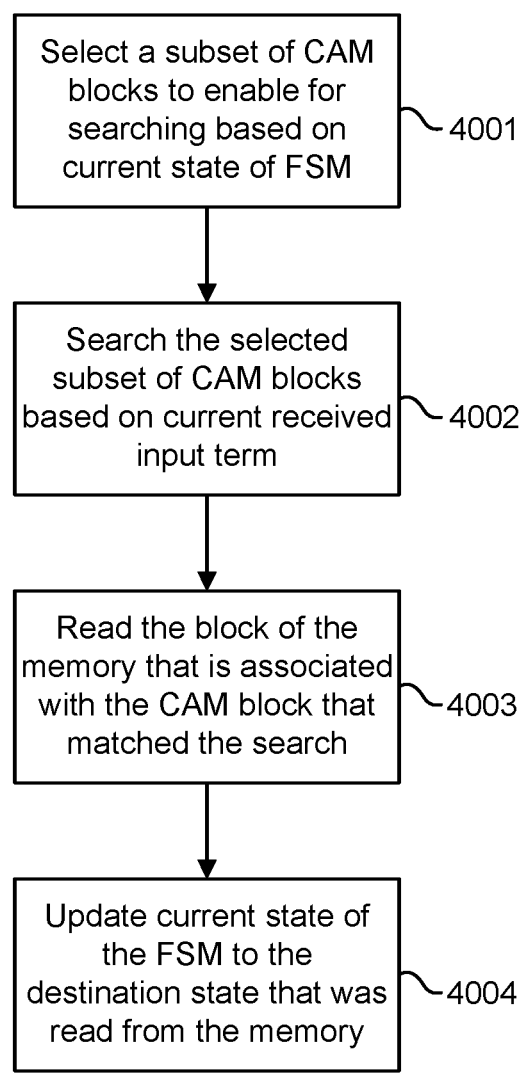
FIG. 11 is a process flow chart illustrating an example method.

FIG. 11 illustrates an example method. The method may be performed using one of the example FSMs 10 described above. For example, the method may be performed by any entity that controls the example FSM 10, directly or indirectly, such as a person or another electronic device (such as processing circuitry executing machine readable instructions). The entity performing the method may be referred to hereinafter as the controller or as a processing circuit. The controller may be part of the FSM 10 or external to the FSM 10 (such as, for example, the processing circuitry 510 illustrated in FIG. 12).

In block 4001, the controller may cause the search enablement logic 300 to select a subset of CAM storage blocks 110 to enable for searching based on a current state of the FSM 10.

In block 4002, the controller may cause the selected subset of blocks 110 of the CAM 100 that were enabled to be searched based on the current received input term.

In block 4003, the controller may cause the storage block 210 of the memory 200 that is associated with the storage block 110 that matched the search to be read.

In block 4004, the controller may cause a current state of the FSM 10 to be updated to equal the destination state identifier that was stored in the storage block 210 that was read in block 4003.

4. Example Electronic Device

The example FSMs 10 described herein may be used in any electronic device, such as, for example, in a personal computer, server, smartphone, tablet, network device, etc.

Figure 12:
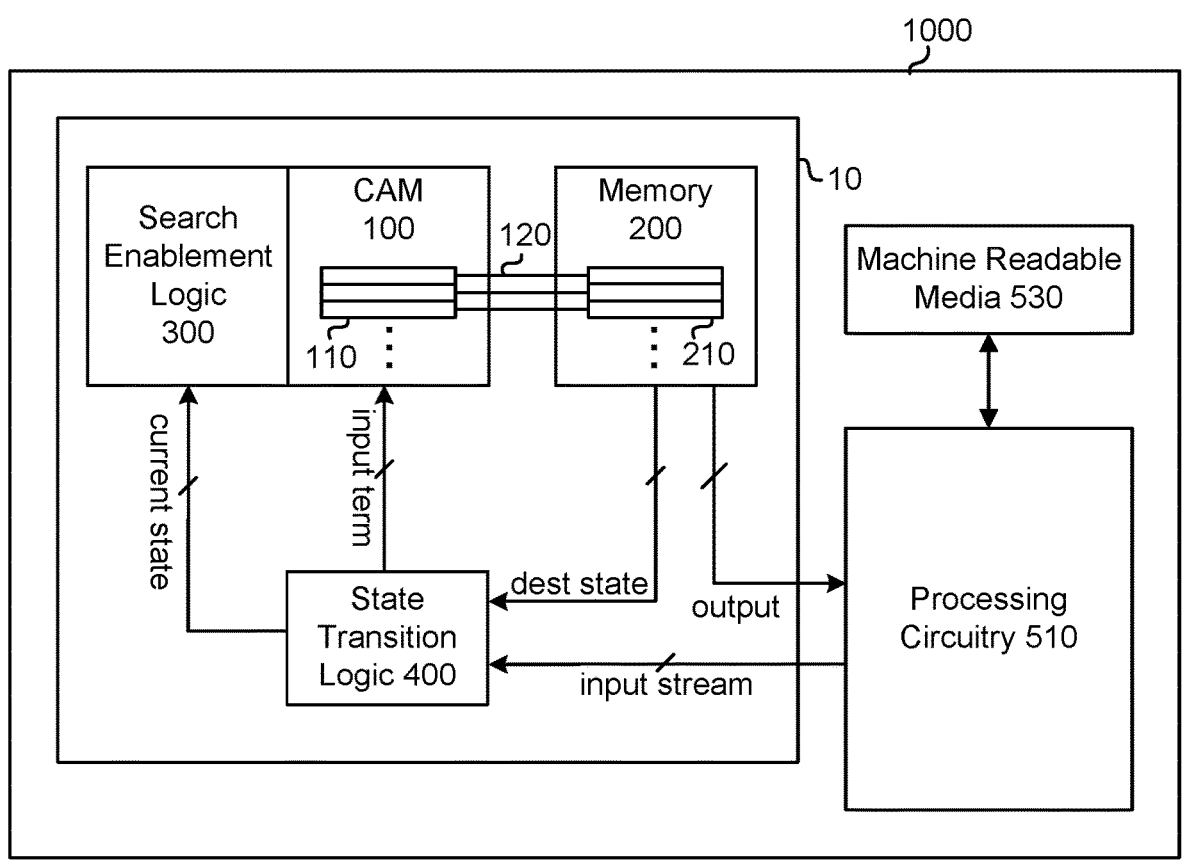
FIG. 12 is an example electronic device.

FIG. 12 illustrates an example device 1000 that includes an example FSM 10. Moreover, some of the features described below could be omitted from the example device 1000 and others not described below could be added.

The device 1000 may include an FSM 10, processing circuitry 510 (also referred to as a controller), and machine readable media 530. The FSM 10 may be an instance of the example FSM 10 described above, and may include a CAM 100, a memory 200, search enablement logic 300, and state transition logic 400.

The processing circuitry 510 may supply the input stream to the FSM 10, and may receive the outputs from the FSM 10. The processing circuitry 510 may also control various operations of the FSM 10, such as, for example, by providing signals to control operations of the CAM 100 and/or memory 200. The processing circuitry 510 may be any circuitry capable of executing machine-readable instructions, such as a central processing unit (CPU), a microprocessor, a microcontroller device, a digital signal processor (DSP), etc. The processing circuitry 510 may also be an application-specific integrated circuit (ASIC), a field-programmable gate array (FPGA), an application-specific instruction set processor (ASIP), or the like, that is configured to perform certain operations described herein.

In some examples, some or all of the search enablement logic 300 may be formed by processing circuitry executing machine readable instructions. In some such examples, the processing circuitry forming the search enablement logic 300 may be distinct from the processing circuitry 510. In other such examples, the processing circuitry 510 may be the processing circuitry forming the search enablement logic 300.

The machine readable media 530 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The machine readable media 530 may store machine-readable instructions that, when executed by the processing circuitry 510, cause the processing circuitry 510 to perform some or all of the operations described herein, such as the operations described above in relation to FIG. 11. In particular, the instructions may cause the processing circuitry 510 to send input terms to the FSM 10, control searching of the CAM 100, and control reading of the memory 200. In some examples, the instructions may also include instructions to cause the processing circuitry 510 to perform operations of the search enablement logic 300. In some examples, the machine readable media 530 and the memory 200 may be part of the same component. In other examples, the machine readable media 530 and the memory 200 may be distinct components.

The example FSMs are described herein and illustrated in the drawings in a conceptual or schematic manner to aid understanding. In particular, physical structures in the example FSMs are referred to and/or illustrated conceptually herein as circuit components, and the relationships between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; and so on. It should be understood that a single physical structure (or set of physical structures) in an actual physical incarnation of an example FSM may serve multiple functions and/or have multiple properties, and thus a single physical structure (or set of physical structures) may be described and/or illustrated herein as multiple distinct circuit components. For example, a single piece of metal in a particular physical incarnation of an example FSMs may serve as both a gate electrode of a transistor and as a wiring line. Thus, the fact that two or more circuit components may be referred to or illustrated herein as distinct components should not be interpreted to mean that their corresponding physical structures in a physical incarnation of the example FSMs are distinct structures.

When reference is made herein or in the appended claims to a first circuit component being "connected to" a second circuit component, this means that: (1) the physical structures corresponding to the first and second components are so arranged that a current path exists there-between, and/or (2) a single physical structure that is electrically conductive serves as at least a part of both the first and second circuit components. Note that, in light of this definition, a reference herein to or illustration in the drawings of multiple circuit components being "connected to" one another does not imply that the circuit components are necessarily separate physical entities. For example, a reference to a first circuit component being "connected to" a second circuit component could encompass: (A) a scenario in which a physical structure that serves as a terminal of the first circuit component is in direct physical contact with a physical structure that serves as a terminal of the second circuit; (B) a scenario in which a physical structure that serves as a terminal of the first circuit component is in direct physical contact with an electrical conductor (e.g., a wiring line) that is itself in direct physical contact with a physical structure that serves as a terminal of the second circuit; (C) a scenario in which the same physical structure that serves as a terminal of the first circuit component also serves as a terminal of the second circuit component; etc.

When reference is made herein or in the appended claims to a first component being "connected between" second and third components, this means that two opposing terminals of the first component are connected to the second component and to the third component, respectively. In particular, when reference is made herein or in the appended claims to a transistor being "connected between" two elements, this means that a source terminal of the transistor (also referred to as a source electrode, source region, source, etc.) is connected to one of the two elements, and a drain terminal of the transistor (also referred to as a drain electrode, drain region, drain, etc.) is connected to the other one of the two elements.

When reference is made herein or in the appended claims to a number of circuit components being "connected in series between" a first element and a second element, this means that the number of circuit components are connected end-to-end in a series, in the same order that they are recited, and that the first circuit component of the series is connected to the first element and the last circuit component of the series is connected to the second element. For example, "A, B, and C are connected in series between D and E" means that D is connected to A, A is connected to B, B is connected to C, and C is connected to E, which may be graphically represented as D-{A-B-C}-E where the dashes ("-") indicate connections and the braces ("{ }") indicate the series.

As used herein, a "switch" is any device that can selectively connect or disconnect two terminals to/from each other. For example, the switch may be a transistor, a multiplexor, a demultiplexor, a mechanical switch, etc. References to a switch being "ON" mean that the two terminals are connected, allowing a signal to pass through the switch, while references to a switch being "OFF" mean that the two terminals are disconnected, preventing a signal from passing through the switch. For example, when a transistor is the switch, the switch is ON when the transistor is ohmic (i.e., a channel has formed), and the switch is OFF when the transistor is not ohmic (i.e., no channel has formed).

Throughout this disclosure and in the appended claims, occasionally reference may be made to "a number" of items. Such references to "a number" mean any integer greater than or equal to one. When "a number" is used in this way, the word describing the item(s) may be written with the pluralized "s" for grammatical consistency, but this does not necessarily mean that multiple items are being referred to. Thus, for example, "a number of comparators" could encompass both one comparator and multiple comparators.

While the above disclosure has been shown and described with reference to the foregoing examples, it should be understood that other forms, details, and implementations may be made without departing from the spirit and scope of this disclosure.

What is claimed is:

1. A method, comprising:
   selecting, by a search enablement logic of a finite state machine (FSM), a subset of content-addressable memory (CAM) storage blocks to be searched based on a current state of the FSM;
   searching, by a CAM of the FSM, the subset of CAM storage blocks selected based on a received input term for a CAM storage block which matches the received input term;
   reading, by a memory of the FSM, a memory storage block associated with an address stored in the matched CAM storage block of the subset of CAM storage blocks; and
   updating, by a state transition logic of the FSM, a state of the FSM based on a destination state read from the memory storage block.

2. The method of claim 1, further comprising:
   receiving, by the state transition logic, an input stream from a controller associated with the FSM; and
   outputting, by the state transition logic, the received input term to the CAM.

3. The method of claim 2, wherein the input stream comprises a plurality of input terms and outputting the received input term to the CAM comprises outputting one of the plurality of input terms each clock cycle.

4. The method of claim 1, further comprising outputting, by the state transition logic, the current state of the FSM to the search enablement logic at a beginning of each clock cycle.

5. The method of claim 4, wherein the current state of the FSM comprises a prior destination address read from a prior memory-storage block and stored in a register of the state transition logic.

6. The method of claim 1, wherein selecting the subset of CAM storage blocks comprises enabling, by the search enablement logic, an active search enable signal for each CAM storage block of the subset of CAM storage blocks.

7. The method of claim 6, wherein the CAM has a NOR-based architecture, and selecting the subset of CAM storage blocks comprises preventing, by the search enablement logic, a precharging voltage from being applied to a matchline of any CAM storage block without the active search enable signal.

8. The method of claim 6, wherein the CAM has a NAND-based architecture, and selecting the subset of CAM storage blocks comprises preventing, by the search enablement logic, a second voltage from being connected a first bit cell of any CAM storage block without the active search enable signal, the active search enable signal comprising a first voltage.

9. The method of claim 6, wherein selecting the subset of CAM storage blocks comprises detecting, by the search enablement logic, the active search enable signal for each CAM storage block.

10. The method of claim 1, wherein search enablement logic comprises group enablement circuits, each group enablement circuit associated with a state of the FSM and configured to control a group of CAM storage blocks.

11. The method of claim 1, wherein each CAM storage block of the CAM is associated with an individual enablement circuit, and selecting the subset of CAM storage blocks comprises:
    enabling, by the search enablement logic, an active search enable signal for each CAM storage block of the subset of CAM storage blocks; and
    setting, by the search enablement logic, a special bit associated with each CAM storage block of the subset of CAM storage blocks,
    wherein the special bit is configured to prevent searching of CAM storage blocks of the subset of CAM storage blocks that are empty.

12. A non-transitory machine-readable storage medium storing instructions that when executed by a processor associated with a finite state machine (FSM) cause the processor to:
    select a subset of content-addressable memory (CAM) storage blocks based on a current state of the FSM;
    search the subset of CAM storage blocks based on an input term for a CAM storage block which matches the received input term;
    in response to identifying a match between the input term and a CAM storage block of the subset of CAM storage blocks, read a memory storage block associated with an address stored in the matched CAM storage block of the subset of CAM storage blocks; and
    update a state of the FSM based on a destination state read from the memory storage block.

13. The non-transitory machine-readable storage medium of claim 12, wherein the processor comprises a processing circuit external to and communicatively coupled to the FSM.

14. The non-transitory machine-readable storage medium of claim 12, the instruction select a subset of CAM storage blocks includes sub-instructions to cause the processor to supply an input stream to a state transition logic of the FSM, the input stream comprising a plurality of input terms.

15. The non-transitory machine-readable storage medium of claim 12, further storing instructions that when executed by the processor cause the processor to receive an output from a memory of the FSM, the output comprising the contents of the memory storage block associated with the matched CAM storage block.

16. A method, comprising:
    receiving, by a search enablement logic of a finite state machine (FSM), a current state of the FSM;
    identifying, by the search enablement logic, a range of addresses associated with the current state of the FSM; and
    enabling, by the search enablement logic, searching of a subset of content-addressable memory (CAM) storage blocks of a CAM of the FSM which fall within the range of addresses associated with the current state of the FSM.

17. The method of claim 16, the search enablement logic comprising a plurality of individual enablement circuits, each individual enablement circuit configured to control search enablement of an associated CAM storage block of the CAM of the FSM.

18. The method of claim 17, wherein enabling searching of the CAM storage blocks comprises:
    reading, by a first individual enablement circuit, the range of addresses carried on a digital bus;
    determining, by the first individual enablement circuit, if the associated CAM storage block falls within the range of addresses; and
    in response to determining the associated CAM storage block is within the range of addresses, outputting, by the first individual enablement circuit, a search enable signal to a wiring line associated with the CAM storage block.

19. The method of claim 17, wherein each individual enablement circuit is configured to output a search enable signal if response to one of:
    the associated CAM storage block matches a start address of the range of addresses carried on a digital bus;
    the associated CAM storage block matches an end address of the range of addresses carried on the digital bus; or
    the associated CAM storage block is between the start address and the end address carried on the digital bus.

20. The method of claim 16, identifying the range comprising consulting a look up table (LUT) that associates CAM storage blocks with states of the FSM.

* * * * *